United States Patent
Petrucelli et al.

(10) Patent No.: US 9,716,471 B2
(45) Date of Patent: Jul. 25, 2017

(54) QUASI-SWITCHED, MULTI-BAND, HIGH-POWER AMPLIFIER AND METHOD

(71) Applicant: Raytheon Company, Waltham, MA (US)

(72) Inventors: Anthony M. Petrucelli, Rancho Palos Verdes, CA (US); Mark A. Talcott, Torrance, CA (US); Samuel D. Tonomura, Rancho Palos Verdes, CA (US); Cynthia Y. Hang, Rolling Hills Estates, CA (US); John Fraschilla, Marina del Ray, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/867,899

(22) Filed: Sep. 28, 2015

(65) Prior Publication Data

US 2016/0181984 A1    Jun. 23, 2016

Related U.S. Application Data

(60) Provisional application No. 62/095,442, filed on Dec. 22, 2014.

(51) Int. Cl.
*H03F 3/68* (2006.01)
*H03F 1/02* (2006.01)
(Continued)

(52) U.S. Cl.
CPC ............ *H03F 1/0205* (2013.01); *H03F 1/56* (2013.01); *H03F 3/19* (2013.01); *H03F 3/211* (2013.01);
(Continued)

(58) Field of Classification Search
CPC ....................................................... H03F 3/68
(Continued)

(56) References Cited

U.S. PATENT DOCUMENTS 6,501,331 B2    12/2002  Adar
9,294,056 B2 *   3/2016  Nobbe ................. H03F 1/0261
(Continued)

FOREIGN PATENT DOCUMENTS

EP           1 345 322 A1    9/2003
EP           1086 528 B1     9/2004
WO      WO 2011/017368 A1    2/2011

OTHER PUBLICATIONS

Notification of Transmittal of the International Search Report and the Written Opinion of the International Searching Authority, or the Declaration dated Jun. 3, 2016 in connection with International Patent Application No. PCT/US2015/056894.

*Primary Examiner* — Patricia T Nguyen

(57) ABSTRACT

A quasi-switched, multi-band, high-power amplifier includes an input matching network, a low band path, a high band path, and an output matching network. The input matching network includes a single input port that is configured to receive an input signal. The input signal includes at least one tone within a specified frequency band. The low band path is configured, when the specified frequency band is a low frequency band, to amplify the input signal to generate a low band amplified signal. The high band path is configured, when the specified frequency band is a high frequency band, to amplify the input signal to generate a high band amplified signal. The output matching network includes a single output port and is configured to filter at least one of the low band amplified signal and the high band amplified signal into a load through the single output port.

20 Claims, 4 Drawing Sheets

(51) Int. Cl.

| | |
|---|---|
| *H03F 3/19* | (2006.01) |
| *H03F 1/56* | (2006.01) |
| *H03F 3/21* | (2006.01) |
| *H03F 3/72* | (2006.01) |
| *H04B 1/00* | (2006.01) |
| *H04B 1/18* | (2006.01) |

(52) U.S. Cl.
CPC ............ *H03F 3/72* (2013.01); *H04B 1/005* (2013.01); *H04B 1/18* (2013.01); *H03F 2200/111* (2013.01); *H03F 2200/318* (2013.01); *H03F 2200/405* (2013.01); *H03F 2200/429* (2013.01); *H03F 2200/451* (2013.01); *H03F 2200/555* (2013.01); *H03F 2203/7209* (2013.01)

(58) Field of Classification Search
USPC ...................................... 330/124 R, 295, 302
See application file for complete search history.

(56) References Cited

U.S. PATENT DOCUMENTS

| | | | |
|---|---|---|---|
| 2008/0129410 A1* | 6/2008 | Fukuda ................. | H03F 1/0288 333/129 |
| 2009/0295473 A1* | 12/2009 | Dupuy ................. | H03F 1/0222 330/124 R |
| 2012/0092074 A1* | 4/2012 | Yanduru ............... | H03F 1/0288 330/295 |
| 2013/0099866 A1 | 4/2013 | Conradi | |
| 2015/0094008 A1* | 4/2015 | Maxim ............... | H01F 17/0013 455/245.1 |
| 2015/0200631 A1* | 7/2015 | Outaleb ............... | H03F 1/0288 330/295 |

* cited by examiner

QUASI-SWITCHED, MULTI-BAND, HIGH-POWER AMPLIFIER AND METHOD

CROSS-REFERENCE TO RELATED APPLICATION AND CLAIM OF PRIORITY

The present application is related to U.S. Provisional Patent Application No. 62/095,442, filed Dec. 22, 2014, titled "Quasi-Switched, Multi-Band, High-Power Amplifier and Method." Provisional Patent Application No. 62/095,442 is assigned to the assignee of the present application and is hereby incorporated by reference into the present application as if fully set forth herein. The present application hereby claims priority under 35 U.S.C. §119(e) to U.S. Provisional Patent Application No. 62/095,442.

GOVERNMENT LICENSE RIGHTS

This invention was made with U.S. Government support. The U.S. Government may have certain rights in this invention.

TECHNICAL FIELD

The present disclosure is directed, in general, to wideband power amplifiers and, more specifically, to a quasi-switched, multi-band, high-power amplifier and method.

BACKGROUND

Conventional solid-state, high-power amplifiers (HPAs) used for wideband applications may have an octave or greater bandwidth. For these HPAs, the second harmonic (and possibly higher order harmonics) generated while operating at lower frequencies will fall within the amplifier's upper frequency band. Thus, the lower-band harmonics will not be filtered out by the amplifier matching networks, resulting in the HPA outputting large undesired signals at harmonic frequencies.

One typical solution to this problem is to implement a dual narrow band HPA with low harmonic output. However, conventional dual narrow band HPAs include switches or diplexers at the input and output of the HPA, which increase the size of the chip and result in loss. Also, adding either switches or diplexers at the output of the HPA will degrade the output power and efficiency of the HPA.

SUMMARY

This disclosure provides a quasi-switched, multi-band, high-power amplifier and method.

In one embodiment, a quasi-switched, multi-band, high-power amplifier includes an input matching network, a low band path, a high band path, and an output matching network. The input matching network includes a single input port that is configured to receive an input signal. The input signal includes at least one tone within a specified frequency band. The low band path is configured, when the specified frequency band is a low frequency band, to amplify the input signal to generate a low band amplified signal. The high band path is configured, when the specified frequency band is a high frequency band, to amplify the input signal to generate a high band amplified signal. The output matching network includes a single output port and is configured to filter at least one of the low band amplified signal and the high band amplified signal into a load through the single output port.

In another embodiment, a quasi-switched, multi-band, high-power amplifier includes an input matching network, a multi-band path, a low band path, a high band path, and an output matching network. The input matching network includes a single input port that is configured to receive an input signal. The input signal includes at least one tone within a specified frequency band. The multi-band path is configured to amplify the input signal to generate a multi-band amplified signal. The low band path is configured, when the specified frequency band is a low frequency band, to amplify the multi-band amplified signal to generate a low band amplified signal. The high band path is configured, when the specified frequency band is a high frequency band, to amplify the multi-band amplified signal to generate a high band amplified signal. The output matching network includes a single output port and is configured to filter at least one of the low band amplified signal and the high band amplified signal into a load through the single output port.

In yet another embodiment, a method for providing quasi-switched, multi-band, high-power amplification includes biasing a low band path and a high band path based on a band selection signal. The band selection signal identifies at least one specified frequency band. An input signal is received at a single input port of an input matching network. The input signal includes at least one tone within the specified frequency band. When the low band path is biased on, the input signal is filtered into the low band path and amplified through the low band path to generate a low band amplified signal. When the high band path is biased on, the input signal is filtered into the high band path and amplified through the high band path to generate a high band amplified signal. At least one of the low band amplified signal and the high band amplified signal is filtered into a load through a single output port of an output matching network.

Other technical features may be readily apparent to one skilled in the art from the following figures, descriptions, and claims.

BRIEF DESCRIPTION OF THE DRAWINGS

For a more complete understanding of the present disclosure, reference is now made to the following description taken in conjunction with the accompanying drawings, in which.

DETAILED DESCRIPTION

FIGS. 1A through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented using any number of techniques, whether currently known or not. Additionally, the drawings are not necessarily drawn to scale.

A solid-state, high-power amplifier (HPA) uses transistors to convert some of the supplied DC power into radiofrequency (RF) gain by amplifying an input signal at the fundamental frequency of the HPA. However, a transistor generates signals at the harmonics of the fundamental frequency $f$ (i.e., $2f$, $3f$, $4f$, etc.). When operating in the non-linear region, the transistor generates relatively large signals at the harmonic frequencies. These undesired harmonic frequencies may be filtered out by matching networks of the HPA if the amplifier bandwidth is not so large that the harmonics fall within band.

For wideband applications, a wide-bandwidth HPA may be used. However, if the wideband HPA has an octave or greater bandwidth, the second harmonic ($2f$) generated while operating at lower frequencies will fall within the HPA's upper frequency band. If the amplifier bandwidth is wide enough, higher order harmonics may also fall within band. Thus, the lower-band harmonics will not be filtered out by the amplifier matching networks, resulting in the HPA outputting large undesired signals at harmonic frequencies.

Wideband HPAs also have inferior performance with respect to output power and efficiency relative to narrow band designs. This is primarily due to the difficulty of properly matching the devices at the fundamental frequency over wide bandwidths. Also, the fact that wideband HPAs have large harmonics when operating at the lower frequency band contributes to their poor performance. For example, power generated at harmonic frequencies means less power at the fundamental frequency, resulting in less than optimum HPA output power and efficiency.

To avoid undesired harmonics, one solution has been to implement dual narrow band HPAs with low harmonic output. However, conventional dual narrow band HPAs include switches or diplexers at the input and output of the HPA, which increase the size of the chip and result in loss. Adding either switches or diplexers at the output of the HPAs will degrade the HPA output power and efficiency.

In addition, for multi-tone applications, undesired intermodulation products are generated. Linearization techniques may be implemented to help with this problem, but these techniques are effective over a limited dynamic range and bandwidth, in addition to increasing circuit size and complexity and reducing amplifier output power and efficiency.

Figure 1A:
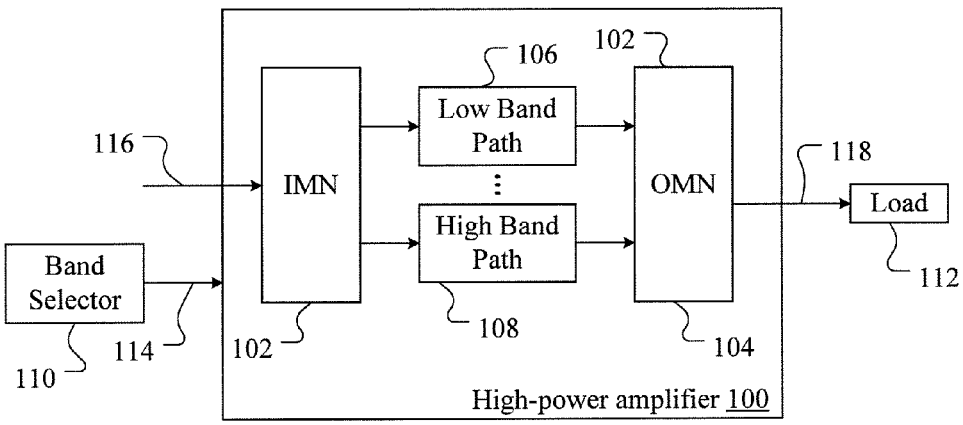
FIGS. 1A and 1B each illustrate a quasi-switched, multi-band, high-power amplifier in accordance with embodiments of the present disclosure.

FIG. 1A illustrates a quasi-switched, multi-band, high-power amplifier 100 in accordance with an embodiment of the present disclosure. The embodiment of the amplifier 100 shown in FIG. 1A is for illustration only. Other embodiments of the amplifier 100 could be used without departing from the scope of this disclosure.

For the illustrated embodiment, the amplifier 100 includes an input matching network (IMN) 102, an output matching network (OMN) 104, a low band path 106 and a high band path 108. The amplifier 100 may be coupled to an external band selector 110 and load 112. The amplifier 100 may be configured to receive a band selection signal 114 from the band selector 110. The band selector 110 may be configured to generate the band selection signal 114 to bias the amplifier 100 to operate within a particular frequency band (e.g., a low frequency band or a high frequency band). In addition, for multi-tone operation, the band selector 110 may be configured to generate the band selection signal 114 to bias the amplifier 100 to operate simultaneously within multiple bands (e.g., both a low frequency band and a high frequency band).

The amplifier 100 is also configured to receive an input signal 116 at a specified frequency or within a specified band corresponding to the band selection signal 114, to amplify the input signal to generate an amplified signal, and to provide the amplified signal as an output signal 118 to the load 112. The input matching network 102 includes a single input port that is configured to receive the input signal 116. The input matching network 102 is configured to provide an input impedance that matches a source impedance associated with the input signal 116. The input matching network 102 is also configured to filter the input signal 116 into either the low band path 106 or the high band path 108 (or both) in accordance with the band selection signal 114. In addition, the output matching network 104 includes a single output port and is configured to combine outputs from the low band path 106 and the high band path 108 and to filter those outputs as a single amplified output signal 118 into the load 112 through the single output port. The output matching network 104 is also configured to provide a specified output impedance.

For some embodiments, the band selection signal 114 may be generated internally within the amplifier 100. For example, the low band path 106 and the high band path 108 may each include a band selector that is configured to convert the input signal 116 to a DC voltage. That DC voltage may then be used to bias either or both of the band paths 106 and 108 on when the input signal 116 is detected.

For low band operation, the band selector 110 (or internal band selector) generates the band selection signal 114 to bias the amplifier 100 to operate within a low frequency band. The input matching network 102 receives a low-frequency input signal 116 at its single input port and filters the input signal 116 into the low band path 106. Because of the biasing of the amplifier 100, a signal output from the input matching network 102 into the high band path 108 terminates within the high band path 108. The low band path 106 then amplifies the input signal 116 to generate an amplified signal, which is provided to the output matching network 104. Finally, the output matching network 104, which is matched to the low frequency band by the biasing of the amplifier 100, filters the amplified signal as an output signal 118 into the load 112. In the same way, for high band operation, a high-frequency input signal 116 is amplified through the high band path 108.

For multi-tone operation, the input signal 116 may include both high and low frequencies. In this case, the input matching network 102 filters the input signal 116 into both the low band path 106 and the high band path 108, and the output matching network 104 filters an amplified signal generated from each path 106 and 108 as a combined output signal 118 into the load 112. For the illustrated amplifier 100, the output signal 118 has significantly decreased intermodulation products as compared to the output of a conventional wideband HPA.

Although FIG. 1A illustrates one example of a quasi-switched, multi-band, high-power amplifier 100, various changes may be made to the embodiment shown in FIG. 1A. For example, the makeup and arrangement of the amplifier 100 are for illustration only. Components could be added, omitted, combined, subdivided, or placed in any other suitable configuration according to particular needs. For a particular example, instead of two bands, the amplifier 100 may be configured to operate within any suitable number of bands, with each possible band having a corresponding band path in the amplifier 100 (as indicated by the ellipsis in FIG. 1A) and the amplifier 100 maintaining a single input for the input signal 116 and a single output for the output signal 118.

Figure 1B:
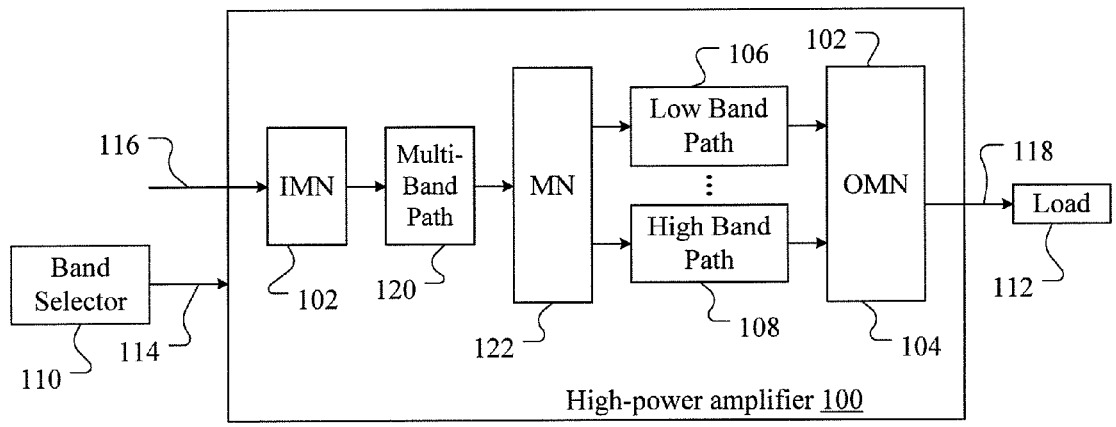

FIG. 1B illustrates a quasi-switched, multi-band, high-power amplifier 100 in accordance with another embodiment of the present disclosure. The embodiment of the amplifier 100 shown in FIG. 1B is for illustration only. Other embodiments of the amplifier 100 could be used without departing from the scope of this disclosure.

Similar to the amplifier 100 of FIG. 1A, the amplifier 100 illustrated in FIG. 1B includes an input matching network IMN 102, an output matching network OMN 104, a low band path 106 and a high band path 108. However, the amplifier 100 of FIG. 1B also includes a multi-band path 120 and a coupling matching network (MN) 122.

The amplifier 100 may be coupled to an external band selector 110 and load 112. The amplifier 100 is configured to receive a band selection signal 114 from the band selector 110. The band selector 110 may be configured to generate the band selection signal 114 to bias the amplifier 100 to operate within a particular frequency band (e.g., a low frequency band or a high frequency band). In addition, for multi-tone operation, the band selector 110 may be configured to generate the band selection signal 114 to bias the amplifier 100 to operate simultaneously within multiple bands (e.g., both a low frequency band and a high frequency band).

The amplifier 100 is also configured to receive an input signal 116 at a specified frequency or within a specified band corresponding to the band selection signal 114, to amplify the input signal to generate an amplified signal, and to provide the amplified signal as an output signal 118 to the load 112. The input matching network 102 includes a single input port that is configured to receive the input signal 116. The input matching network 102 is configured to provide an input impedance that matches a source impedance associated with the input signal 116. The input matching network 102 is also configured to filter the input signal 116 into the multi-band path 120, which is configured to amplify the input signal 116 to generate a multi-band amplified signal.

The coupling matching network 122 is configured to couple the multi-band path 120 to the low band path 106 and/or the high band path 108. The coupling matching network 122 is also configured to provide an input impedance that matches an output impedance of the multi-band path 120 and an output impedance that matches the input impedance of the low band path 106 and/or the high band path 108. Finally, the coupling matching network 122 is configured to filter the multi-band amplified signal into either the low band path 106 or the high band path 108 (or both) in accordance with the band selection signal 114.

The output matching network 104, which includes a single output port, is configured to combine outputs from the low band path 106 and the high band path 108 and to filter those outputs as a single amplified output signal 118 into the load 112 through the single output port. The output matching network 104 is also configured to provide a specified output impedance.

For some embodiments, the band selection signal 114 may be generated internally within the amplifier 100. For example, the low band path 106 and the high band path 108 may each include a band selector that is configured to convert the input signal 116 to a DC voltage. That DC voltage may then be used to bias either or both of the band paths 106 and 108 on when the input signal 116 is detected.

For low band operation, the band selector 110 (or internal band selector) generates the band selection signal 114 to bias the amplifier 100 to operate within a low frequency band. The input matching network 102 receives a low-frequency input signal 116 at its single input port and filters the input signal 116 into the multi-band path 120. The multi-band path 120 amplifies the input signal 116 to generate a multi-band amplified signal, which is provided to the coupling matching network 122.

The coupling matching network 122 filters the multi-band amplified signal into the low band path 106. Because of the biasing of the amplifier 100, a signal output from the coupling matching network 122 into the high band path 108 terminates within the high band path 108. The low band path 106 then amplifies the multi-band amplified signal to generate a low band amplified signal, which is provided to the output matching network 104. Finally, the output matching network 104, which is matched to the low frequency band by the biasing of the amplifier 100, filters the low band amplified signal as an output signal 118 into the load 112. In the same way, for high band operation, a high-frequency input signal 116 is amplified through the multi-band path 122 and the high band path 108.

For multi-tone operation, the input signal 116 may include both high and low frequencies. In this case, the coupling matching network 122 filters the multi-band amplified signal into both the low band path 106 and the high band path 108, and the output matching network 104 combines an amplified signal generated from each path 106 and 108 and filters the combination as an output signal 118 into the load 112. For the illustrated amplifier 100, the output signal 118 has significantly decreased intermodulation products as compared to the output of a conventional wideband HPA.

Although FIG. 1B illustrates one example of a quasi-switched, multi-band, high-power amplifier 100, various changes may be made to the embodiment shown in FIG. 1B. For example, the makeup and arrangement of the amplifier 100 are for illustration only. Components could be added, omitted, combined, subdivided, or placed in any other suitable configuration according to particular needs. For a particular example, instead of two bands, the amplifier 100 may be configured to operate within any suitable number of bands, with each possible band having a corresponding band path in the amplifier 100 (as indicated by the ellipsis in FIG. 1B) and the amplifier 100 maintaining a single input for the input signal 116 and a single output for the output signal 118.

Using either of the embodiments of FIG. 1A or FIG. 1B, a quasi-switched, multi-band, high-power amplifier 100 may be configured so as to generate an amplified output signal 118 having significantly lower harmonic content as compared to a conventional wideband HPA, without including switches or diplexers. Thus, the amplifier 100 may have a smaller chip size relative to a conventional wideband chip footprint. In addition, using the amplifier 100, efficiency is improved, intermodulation products are reduced, and power added efficiency (PAE) of the amplifier 100 is improved relative to a conventional wideband HPA.

Furthermore, the amplifier 100 may be simultaneously operated at both low band and high band while maintaining excellent performance. In this mode of operation, each band still provides the harmonic rejection of a narrow band HPA and greatly reduces intermodulation products, even at high compression levels where the amplifier 100 is operating at maximum PAE. For two-tone operation at low band (or high band) where the tones are closely spaced and the amplifier 100 is compressed, the amplifier 100 may generate high third-order intermodulation products similar to a typical HPA that does not employ linearization techniques. However, linearization techniques could more easily be applied over narrow bandwidths to each band in the multi-band configuration of the amplifier 100 than could be applied to a single wideband HPA.

Figure 2:
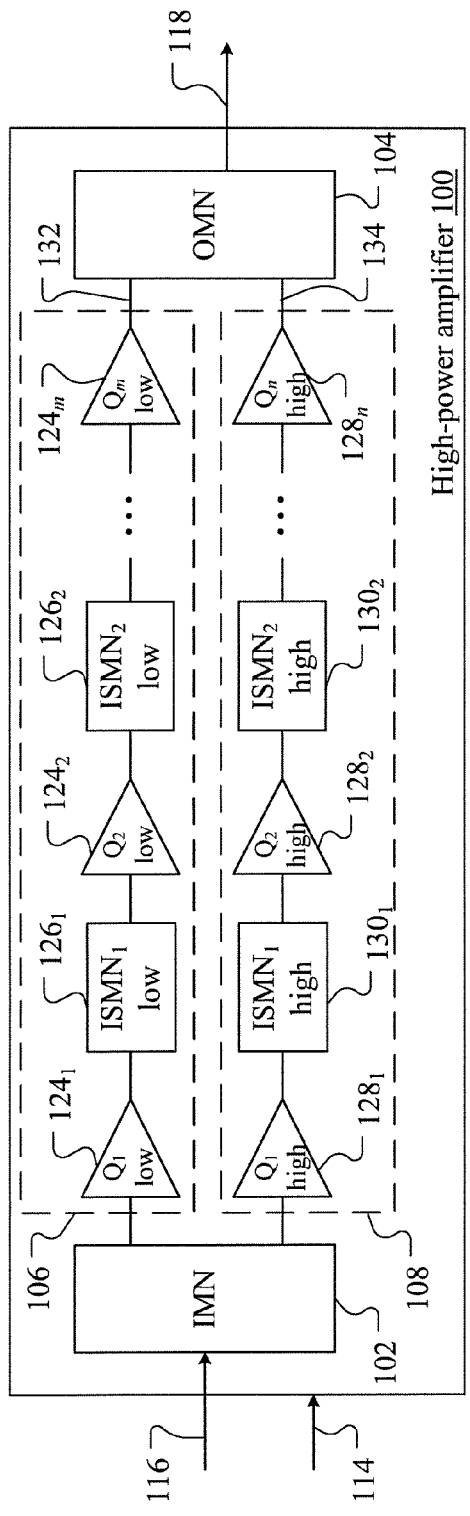
FIG. 2 illustrates the high-power amplifier of FIG. 1A in accordance with an embodiment of the present disclosure.

FIG. 2 illustrates the high-power amplifier 100 in accordance with an embodiment of the present disclosure. The embodiment of the amplifier 100 shown in FIG. 2 is for illustration only. Other embodiments of the amplifier 100 could be used without departing from the scope of this disclosure.

For the illustrated embodiment, the low band path 106 includes m low band stages $124_1$-$124_m$ and m−1 low band, interstage matching networks (ISMNs) $126_1$-$126_{m-1}$, and the high band path 108 includes n high band stages $128_1$-$128_n$ and n−1 high band, ISMNs $130_1$-$130_{n-1}$. The number m of low band stages 124 may include any suitable integer, and the number n of high band stages 128 may include any suitable integer. Thus, m may be less than, equal to, or greater than n.

Each ISMN 126 and 130 may include filter components configured to match the output impedance of a preceding stage 124 or 128 to the input impedance of a following stage 124 or 128. For the illustrated embodiment, each stage 124 and 128 is represented by an amplifier that includes a transistor. Thus, for example, $ISMN_1$, low $126_1$ is configured to match the output impedance of $Q_1$, low $124_1$ to the input impedance of $Q_2$, low $124_2$.

The low band path 106 is configured to generate a low band amplified signal 132 for the output matching network 104, and the high band path 108 is configured to generate a high band amplified signal 134 for the output matching network 104. The output matching network 104 is configured to combine the low band amplified signal 132, if any, with the high band amplified signal 134, if any, and to filter the combination to generate the output signal 118.

The amplifier 100 is configured to switch between low band and high band operation by switching on the DC bias for the desired band, while the other band is biased off (e.g., $V_{ds}$=0 V and $V_{gs}$=0 V or other suitable value such that the corresponding transistor is switched off). The amplifier 100 does not include any switches or diplexers to isolate the two band paths 106 and 108. Instead, any isolation between the band paths 106 and 108 is designed into the input matching network 102 and the output matching network 104. The input matching network 102 and the output matching network 104 may each be configured to simultaneously provide a good match to the low band path 106 while the high band path 108 is off and a good match to the high band path 108 while the low band path 106 is off.

Although FIG. 2 illustrates one example of a quasi-switched, multi-band, high-power amplifier 100, various changes may be made to the embodiment shown in FIG. 2. For example, the makeup and arrangement of the amplifier 100 are for illustration only. Components could be added, omitted, combined, subdivided, or placed in any other suitable configuration according to particular needs. For a particular example, although the illustrated embodiment includes an external band selection signal 114, it will be understood that a band selection signal may be generated internally within the amplifier 100.

Figure 3:
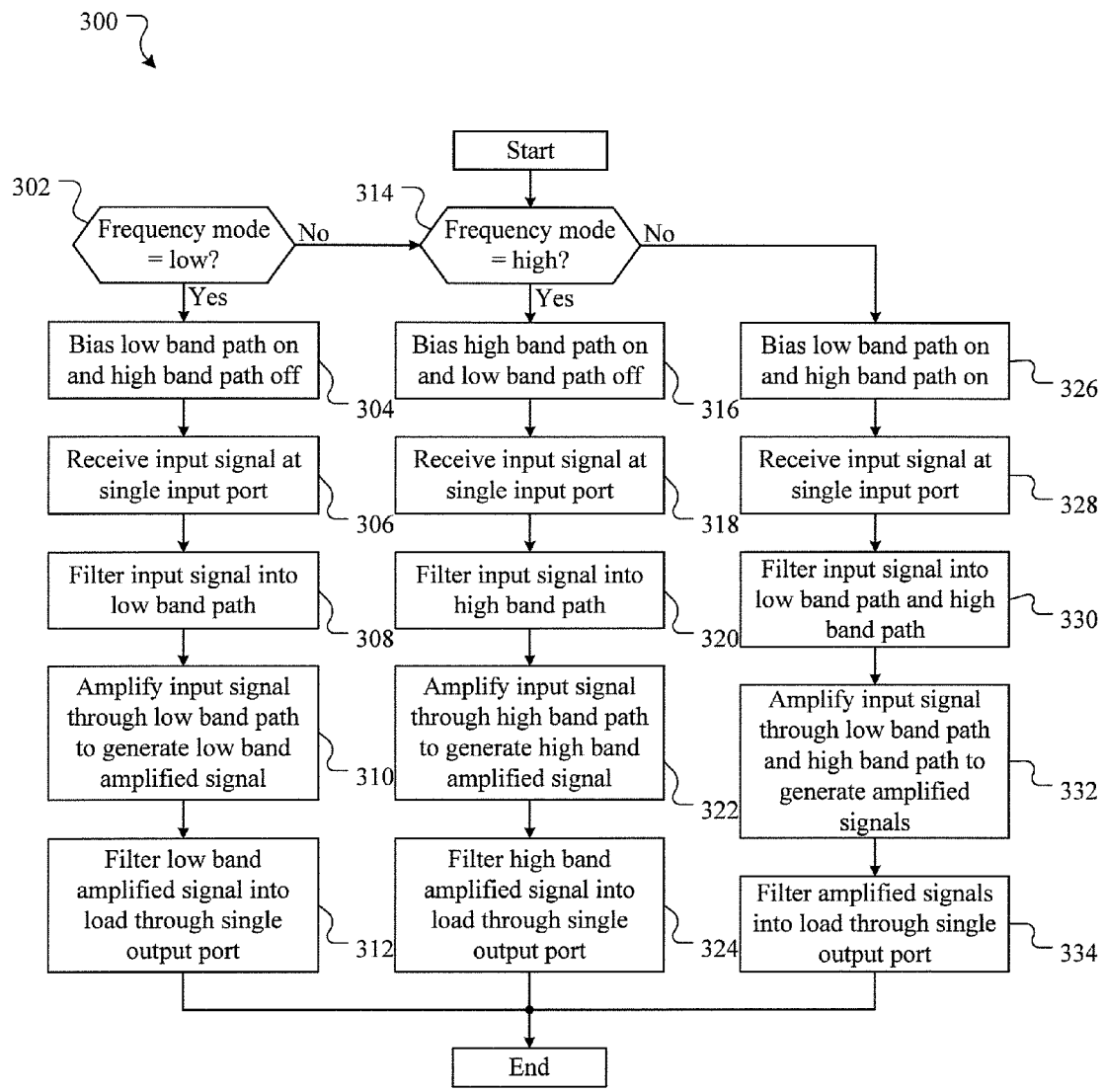
FIG. 3 is a flowchart illustrating a method for providing quasi-switched, multi-band, high-power amplification in accordance with an embodiment of the present disclosure.

FIG. 3 is a flowchart illustrating a method 300 for providing quasi-switched, multi-band, high-power amplification in accordance with an embodiment of the present disclosure. For some embodiments, the method 300 may be performed by the amplifier 100 shown in FIG. 1A or the amplifier 100 shown in FIG. 2. The method 300 shown in FIG. 3 is for illustration only. Quasi-switched, multi-band, high-power amplification may be provided in any other suitable manner without departing from the scope of this disclosure.

Initially, a determination is made as to whether the amplifier 100 is operating in a low-frequency mode (step 302). For example, in some embodiments, an external band selector 110 or internal band selector provides a band selection signal 114 for the amplifier 100 that indicates a mode for the amplifier 100. Thus, although the description below refers to the band selector 110, it will be understood that an internal band selector may also perform the corresponding function. The mode corresponds to a frequency band for input signals received at the amplifier 100. Thus, if the input signals will be in a low-frequency band, the amplifier 100 is operating in the low-frequency mode. Similarly, if the input signals will be in a high-frequency band, the amplifier 100 is operating in a high-frequency mode. Finally, if the input signals will be in the low-frequency band and/or the high-frequency band, the amplifier 100 is operating in a multi-frequency mode.

If the amplifier 100 is operating in the low-frequency mode (step 302), a low band path 106 is biased on and a high band path 108 is biased off (step 304). As a particular example, in some embodiments, the band selector 110 generates the band selection signal 114, which biases transistors in the low band path 106 on and transistors in the high band path 108 off.

An input signal 116 within the low-frequency band is received at a single input port of an input matching network 102 (step 306). The input matching network 102 filters the input signal 116 into the low band path 106 (step 308). As a particular example, in some embodiments, the input signal 116 may be processed through the low band path 106, while terminating in $Q_1$, high $128_1$ of the high band path 108.

The input signal 116 is amplified through the low band path 106 to generate a low band amplified signal 132, while the high band path 108 generates substantially no high band amplified signal 134 (step 310). The low band amplified signal 132 is filtered (as the output signal 118) into a load 112 through a single output port of an output matching network 104 (step 312).

If the amplifier is not operating in the low-frequency mode (step 302), a determination is made as to whether the amplifier 100 is operating in the high-frequency mode (step 314). If the amplifier 100 is operating in the high-frequency mode (step 314), the high band path 108 is biased on and the low band path 106 is biased off (step 316). As a particular example, in some embodiments, the band selector 110 generates the band selection signal 114, which biases transistors in the high band path 108 on and transistors in the low band path 106 off.

An input signal 116 within the high-frequency band is received at the single input port of the input matching network 102 (step 318). The input matching network 102 filters the input signal 116 into the high band path 108 (step 320). As a particular example, in some embodiments, the input signal 116 may be processed through the high band path 108, while terminating in $Q_1$, low $124_1$ of the low band path 106.

The input signal 116 is amplified through the high band path 108 to generate a high band amplified signal 134, while the low band path 106 generates substantially no low band amplified signal 132 (step 322). The high band amplified signal 134 is filtered (as the output signal 118) into the load 112 through the single output port of the output matching network 104 (step 324).

If the amplifier is not operating in the low-frequency mode (step 302) or the high-frequency mode (step 314), the amplifier 100 is operating in a multi-frequency mode. When the amplifier 100 is operating in the multi-frequency mode, both the low band path 106 and the high band path 108 are biased on (step 326). As a particular example, in some embodiments, the band selector 110 generates the band selection signal 114, which biases transistors in both the low band path 106 and the high band path 108 on.

An input signal 116 within the low-frequency band, the high-frequency band, or both the low- and high-frequency bands is received at the single input port of the input matching network 102 (step 328). The input matching network 102 filters the input signal 116 into the low band path 106 and the high band path 108 (step 330). The input signal 116 is amplified through the low band path 106 to generate a low band amplified signal 132 and through the high band path 108 to generate a high band amplified signal 134 (step 332). The low band amplified signal 132 and the high band amplified signal 134 are combined and filtered (as the output signal 118) into the load 112 through the single output port of the output matching network 104 (step 334).

Although FIG. 3 illustrates one example of a method 300 for providing quasi-switched, multi-band, high-power amplification, various changes may be made to the embodiment shown in FIG. 3. For example, while shown as a series of steps, various steps in FIG. 3 could overlap, occur in parallel, occur in a different order, or occur multiple times. Also, for a particular example, in some embodiments, the amplifier 100 may include more than two band paths. For example, in addition to the low band path 106 and the high band path 108, the amplifier 100 may include one or more mid-band paths configured to amplify an input signal within one or more additional frequency bands. For these embodiments, a similar process may be performed for each additional band path based on the band selection signal 114. In addition, all the band paths or any particular subset of the band paths may be processed together in a multi-frequency mode.

Figure 4:
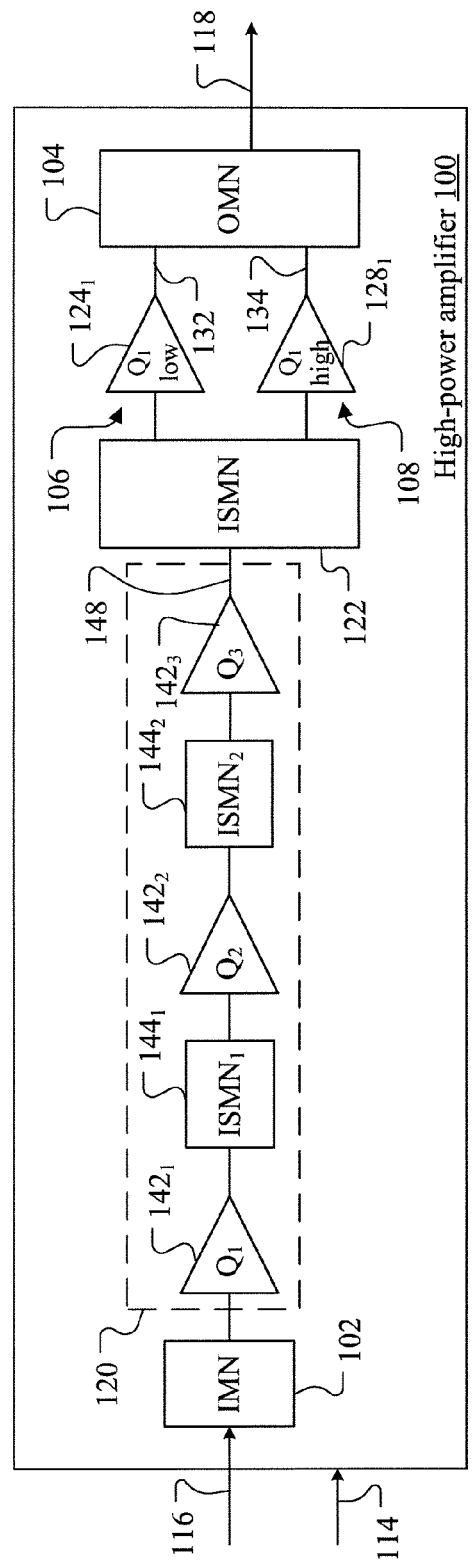
FIG. 4 illustrates the high-power amplifier of FIG. 1B in accordance with an embodiment of the present disclosure.

FIG. 4 illustrates the high-power amplifier 100 in accordance with another embodiment of the present disclosure. The embodiment of the amplifier 100 shown in FIG. 4 is for illustration only. Other embodiments of the amplifier 100 could be used without departing from the scope of this disclosure.

In addition to a low band path 106 and a high band path 108, the amplifier 100 of FIG. 4 includes a multi-band path 120. For the particular embodiment illustrated in FIG. 4, the low band path 106 includes one low band stage $124_1$, the high band path 108 includes one high band stage $128_1$, and the multi-band path 120 includes three multi-band stages $142_1$-$142_3$ and two multi-band, interstage matching networks (ISMNs) $144_1$-$144_2$. Each multi-band stage 142 is wideband-matched such that it can handle both a low frequency band and a high frequency band. The amplifier 100 also includes a coupling ISMN 122 that is configured to couple the multi-band path 120 to the low band path 106 and/or the high band path 108.

It will be understood that the number of low band stages 124 and the number of high band stages 128 may each include any suitable integer and that the number of low band stages 124 may be less than, equal to, or greater than the number of high band stages 128. Also, for embodiments in which the low band path 106 or the high band path 108 includes more than one stage 124 or 128, the amplifier 100 also includes an ISMN 126 or 130 (not shown in FIG. 4) between consecutive stages 124 or 128. Furthermore, it will be understood that the number of multi-band stages 142 may include any suitable integer and that an ISMN 144 is included between consecutive stages 142.

The $ISMN_1$ $144_1$, the $ISMN_2$ $144_2$, and the coupling ISMN 122 (in addition to any ISMNs 126 and 130) may include filter components configured to match the output impedance of a preceding stage to the input impedance of a following stage. For the illustrated embodiment, each stage 124, 128 and 142 is represented by an amplifier that includes a transistor. Thus, for example, $ISMN_1$ $144_1$ is configured to match the output impedance of $Q_1$ $142_1$ to the input impedance of $Q_2$ $142_2$. Also, for another example, the coupling ISMN 122 is configured to match the output impedance of $Q$ $142_3$ to the input impedance of $Q_1$, low $124_1$ and/or $Q_1$, high $128_1$ based on the band selection signal 114.

The amplifier 100 is configured to switch between low band and high band operation by switching on the DC bias for the desired band, while the other band is biased off (e.g., $V_{ds}$=0 V and $V_{gs}$=0 V or other suitable value such that the corresponding transistor is switched off). The amplifier 100 does not include any switches or diplexers to isolate the two band paths 106 and 108. Instead, any isolation between the band paths 106 and 108 is designed into the coupling ISMN 122 and the output matching network 104. The coupling ISMN 122 and the output matching network 104 may each be configured to simultaneously provide a good match to the low band path 106 while the high band path 108 is off and a good match to the high band path 108 while the low band path 106 is off.

For this embodiment, second-order harmonics may be generated through the stages 142 of the multi-band path 120. However, the coupling ISMN 122 is configured to filter out these second-order harmonics from a multi-band amplified signal 148 that is output from the final stage 142 of the multi-band path 120 (i.e., $Q_3$ $142_3$ in the illustrated embodiment). Thus, the coupling ISMN 122 is configured to filter the multi-band amplified signal 148 into either the low band path 106 or the high band path 108 (or both) in accordance with the band selection signal 114. In addition, the output matching network 104 includes a single output port that is configured to combine outputs from the low band path 106 and the high band path 108 to output a single amplified output signal 118 to the load 112 from either the low band path 106 or the high band path 108 (or both) in accordance with the band selection signal 114.

Although FIG. 4 illustrates one example of a quasi-switched, multi-band, high-power amplifier 100, various changes may be made to the embodiment shown in FIG. 4. For example, the makeup and arrangement of the amplifier 100 are for illustration only. Components could be added, omitted, combined, subdivided, or placed in any other suitable configuration according to particular needs. For a particular example, although the illustrated embodiment includes an external band selection signal 114, it will be understood that a band selection signal may be generated internally within the amplifier 100.

Figure 5:
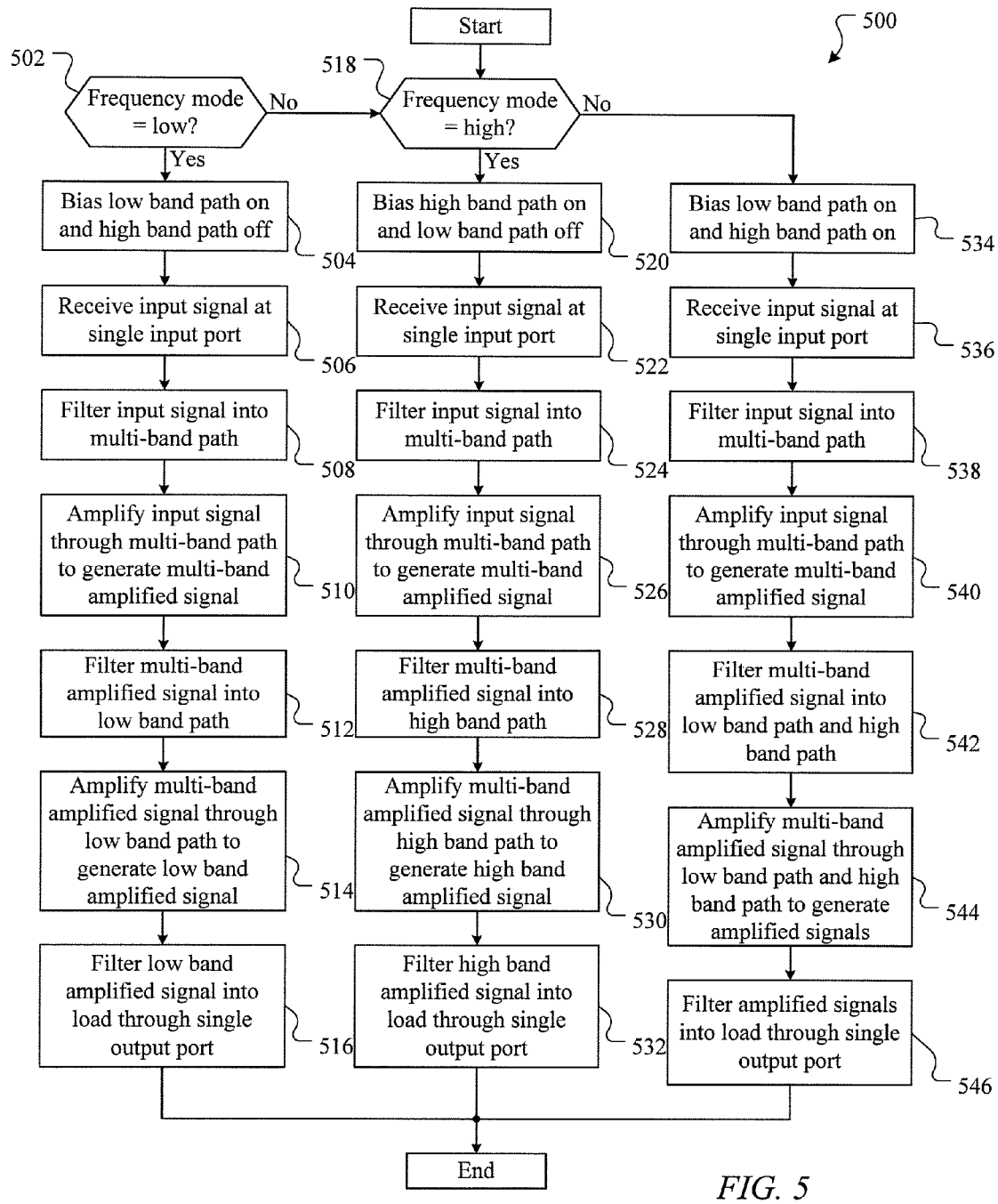
FIG. 5 is a flowchart illustrating a method for providing quasi-switched, multi-band, high-power amplification in accordance with an embodiment of the present disclosure.

FIG. 5 is a flowchart illustrating a method 500 for providing quasi-switched, multi-band, high-power amplification in accordance with another embodiment of the present disclosure. For some embodiments, the method 500 may be performed by the amplifier 100 shown in FIG. 1B or the amplifier 100 shown in FIG. 4. The method 500 shown in FIG. 5 is for illustration only. Quasi-switched, multi-band, high-power amplification may be provided in any other suitable manner without departing from the scope of this disclosure.

Initially, a determination is made as to whether the amplifier 100 is operating in a low-frequency mode (step 502). For example, in some embodiments, an external band selector 110 or internal band selector provides a band selection signal 114 to the amplifier 100 that indicates a mode for the amplifier 100. Thus, although the description below refers to the band selector 110, it will be understood that an internal band selector may also perform the corresponding function. The mode corresponds to a frequency band for input signals received at the amplifier 100. Thus, if the input signals will be in a low-frequency band, the amplifier 100 is operating in the low-frequency mode. Similarly, if the input signals will be in a high-frequency band, the amplifier 100 is operating in a high-frequency mode. Finally, if the input signals will be in the low-frequency band and/or the high-frequency band, the amplifier 100 is operating in a multi-frequency mode.

If the amplifier 100 is operating in the low-frequency mode (step 502), a low band path 106 is biased on and a high band path 108 is biased off (step 504). As a particular example, in some embodiments, the band selector 110 generates the band selection signal 114, which biases transistors in the low band path 106 on and transistors in the high band path 108 off.

An input signal 116 within the low-frequency band is received at a single input port of an input matching network 102 (step 506). The input matching network 102 filters the input signal 116 into a multi-band path 120 (step 508). The input signal 116 is amplified through the multi-band path 120 to generate a multi-band amplified signal 148 (step 510).

A coupling ISMN 122 filters the multi-band amplified signal 148 into the low band path 106 (step 512). As a particular example, in some embodiments, the multi-band amplified signal 148 may be processed through the low band path 106, while terminating in $Q_1$, high $128_1$ of the high band path 108.

The multi-band amplified signal 148 is amplified through the low band path 106 to generate a low band amplified signal 132, while the high band path 108 generates substantially no high band amplified signal 134 (step 514). The low band amplified signal 132 is filtered (as the output signal 118) into a load 112 through a single output port of an output matching network 104 (step 516).

If the amplifier is not operating in the low-frequency mode (step 502), a determination is made as to whether the amplifier 100 is operating in a high-frequency mode (step 518). If the amplifier 100 is operating in the high-frequency mode (step 518), the high band path 108 is biased on and the low band path 106 is biased off (step 520). As a particular example, in some embodiments, the band selector 110 generates the band selection signal 114, which biases transistors in the high band path 108 on and transistors in the low band path 106 off.

An input signal 116 within the high-frequency band is received at the single input port of the input matching network 102 (step 522). The input matching network 102 filters the input signal 116 into the multi-band path 120 (step 524). The input signal 116 is amplified through the multi-band path 120 to generate a multi-band amplified signal 148 (step 526).

The coupling ISMN 122 filters the multi-band amplified signal 148 into the high band path 108 (step 528). As a particular example, in some embodiments, the multi-band amplified signal 148 may be processed through the high band path 108, while terminating in $Q_1$, low $124_1$ of the low band path 106.

The multi-band amplified signal 148 is amplified through the high band path 108 to generate a high band amplified signal 134, while the low band path 106 generates substantially no low band amplified signal 132 (step 530). The high band amplified signal 134 is filtered (as the output signal 118) into the load 112 through the single output port of the output matching network 104 (step 532).

If the amplifier is not operating in the low-frequency mode (step 502) or the high-frequency mode (step 518), the amplifier 100 is operating in a multi-frequency mode. When the amplifier 100 is operating in the multi-frequency mode, both the low band path 106 and the high band path 108 are biased on (step 534). As a particular example, in some embodiments, the band selector 110 generates the band selection signal 114, which biases transistors in both the low band path 106 and the high band path 108 on.

An input signal 116 within the low-frequency band, the high-frequency band, or both the low- and high-frequency bands is received at the single input port of the input matching network 102 (step 536). The input matching network 102 filters the input signal 116 into the multi-band path 120 (step 538). The input signal 116 is amplified through the multi-band path 120 to generate a multi-band amplified signal 148 (step 540).

The coupling ISMN 122 filters the multi-band amplified signal 148 into the low band path 106 and the high band path 108 (step 542). The multi-band amplified signal 148 is amplified through the low band path 106 to generate a low band amplified signal 132 and through the high band path 108 to generate a high band amplified signal 134 (step 544). The low band amplified signal 132 and the high band amplified signal 134 are combined and filtered (as the output signal 118) into the load 112 through the single output port of the output matching network 104 (step 546).

Although FIG. 5 illustrates one example of a method 500 for providing quasi-switched, multi-band, high-power amplification, various changes may be made to the embodiment shown in FIG. 5. For example, while shown as a series of steps, various steps in FIG. 5 could overlap, occur in parallel, occur in a different order, or occur multiple times. Also, for a particular example, in some embodiments, the amplifier 100 may include more than two band paths. For example, in addition to the low band path 106 and the high band path 108, the amplifier 100 may include one or more mid-band paths configured to amplify an input signal within one or more additional frequency bands. For these embodiments, a similar process may be performed for each additional band path based on the band selection signal 114. In addition, all the band paths or any particular subset of the band paths may be processed together in a multi-frequency mode.

Modifications, additions, or omissions may be made to the apparatuses and methods described here without departing from the scope of the disclosure. For example, the components of the apparatuses may be integrated or separated. The methods may include more, fewer, or other steps. Additionally, as described above, steps may be performed in any suitable order.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The term "each" refers to each member of a set or each member of a subset of a set. Terms such as "over" and "under" may refer to relative positions in the figures and do not denote required orientations during manufacturing or use. Terms such as "higher" and "lower" denote relative values and are not meant to imply specific values or ranges of values. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A quasi-switched, multi-band, high-power amplifier, comprising:
   an input matching network comprising a single input port configured to receive an input signal, wherein the input signal comprises at least one tone within a specified frequency band;
   a low band path configured, when the specified frequency band is a low frequency band, to amplify the input signal to generate a low band amplified signal;
   a high band path configured, when the specified frequency band is a high frequency band, to amplify the input signal to generate a high band amplified signal; and
   an output matching network comprising a single output port, wherein the output matching network is configured to filter at least one of the low band amplified signal and the high band amplified signal into a load through the single output port;
   wherein the low band path comprises m low band stages and m−1 low band interstage matching networks (ISMNs), and wherein the high band path comprises n high band stages and n−1 high band ISMNs.

2. The amplifier of claim 1, wherein the input signal comprises a first tone within the low frequency band and a second tone within the high frequency band.

3. The amplifier of claim 1, wherein the output matching network is further configured to combine the low band amplified signal and the high band amplified signal to generate a combined output signal and to filter the combined output signal into the load.

4. The amplifier of claim 1, further comprising:
   at least one mid-band path configured, when the specified frequency band is a mid-frequency band, to amplify the input signal to generate a mid-band amplified signal,
   wherein the output matching network is further configured to filter at least one of the low band amplified signal, the high band amplified signal, and the mid-band amplified signal into the load.

5. The amplifier of claim 1, wherein:
   each low band ISMN is coupled between two adjacent low band stages; and
   each high band ISMN is coupled between two adjacent high band stages.

6. The amplifier of claim 1, wherein each low band and high band stage comprises a transistor.

7. A quasi-switched, multi-band, high-power amplifier, comprising:
   an input matching network comprising a single input port configured to receive an input signal, wherein the input signal comprises at least one tone within a specified frequency band;
   a multi-band path configured to amplify the input signal to generate a multi-band amplified signal;
   a low band path configured, when the specified frequency band is a low frequency band, to amplify the multi-band amplified signal to generate a low band amplified signal;
   a high band path configured, when the specified frequency band is a high frequency band, to amplify the multi-band amplified signal to generate a high band amplified signal; and
   an output matching network comprising a single output port, wherein the output matching network is configured to filter at least one of the low band amplified signal and the high band amplified signal into a load through the single output port;
   wherein the multi-band path comprises l multi-band stages and l−1 multi-band interstage matching networks (ISMNs).

8. The amplifier of claim 7, further comprising a coupling matching network configured to match an output impedance of the multi-band path to an input impedance of at least one of the low band path and the high band path.

9. The amplifier of claim 7, wherein the output matching network is further configured to combine the low band amplified signal and the high band amplified signal to generate a combined output signal and to filter the combined output signal into the load.

10. The amplifier of claim 7, further comprising:
    at least one mid-band path configured, when the specified frequency band is a mid-frequency band, to amplify the multi-band amplified signal to generate a mid-band amplified signal,
    wherein the output matching network is further configured to filter at least one of the low band amplified signal, the high band amplified signal, and the mid-band amplified signal into the load.

11. The amplifier of claim 7, wherein the low band path comprises m low band stages and m−1 low band ISMNs, and wherein the high band path comprises n high band stages and n−1 high band ISMNs.

12. The amplifier of claim 11, wherein each low band and high band stage comprises a transistor.

13. A method for providing quasi-switched, multi-band, high-power amplification, comprising:
    biasing a low band path and a high band path based on a band selection signal, wherein the band selection signal identifies at least one specified frequency band;
    receiving an input signal at a single input port of an input matching network, wherein the input signal comprises at least one tone within the at least one specified frequency band;
    when the low band path is biased on, filtering the input signal into the low band path and amplifying the input signal through the low band path to generate a low band amplified signal;
    when the high band path is biased on, filtering the input signal into the high band path and amplifying the input signal through the high band path to generate a high band amplified signal; and
    filtering at least one of the low band amplified signal and the high band amplified signal into a load through a single output port of an output matching network;
    wherein the low band path comprises m low band stages and m−1 low band interstage matching networks (ISMNs), and wherein the high band path comprises n high band stages and n−1 high band ISMNs.

14. The method of claim 13, wherein the input signal comprises a first tone within the low frequency band and a second tone within the high frequency band, the method further comprising combining the low band amplified signal and the high band amplified signal to generate a combined output signal, wherein filtering at least one of the low band amplified signal and the high band amplified signal into the load comprises filtering the combined output signal into the load.

15. The method of claim 13, further comprising:
biasing at least one mid-band path based on the band selection signal; and
when the mid-band path is biased on, filtering the input signal into the mid-band path and amplifying the input signal through the mid-band path to generate a mid-band amplified signal,
wherein filtering at least one of the low band amplified signal and the high band amplified signal into the load comprises filtering at least one of the low band amplified signal, the high band amplified signal, and the mid-band amplified signal into the load.

16. The method of claim 13, wherein:
each low band ISMN is coupled between two adjacent low band stages; and
each high band ISMN is coupled between two adjacent high band stages.

17. The method of claim 13, wherein amplifying the input signal through the low band path further comprises matching an output impedance of a preceding low band stage to an input impedance of a following low band stage, and wherein amplifying the input signal through the high band path further comprises matching an output impedance of a preceding high band stage to an input impedance of a following high band stage.

18. A method for providing quasi-switched, multi-band, high-power amplification, comprising:
biasing a low band path and a high band path based on a band selection signal, wherein the band selection signal identifies at least one specified frequency band;
receiving an input signal at a single input port of an input matching network, wherein the input signal comprises at least one tone within the at least one specified frequency band;
filtering the input signal into a multi-band path;
amplifying the input signal through the multi-band path to generate a multi-band amplified signal;
when the low band path is biased on, filtering the multi-band amplified signal into the low band path and amplifying the multi-band amplified signal through the low band path to generate a low band amplified signal;
when the high band path is biased on, filtering the multi-band amplified signal into the high band path and amplifying the multi-band amplified signal through the high band path to generate a high band amplified signal; and
filtering at least one of the low band amplified signal and the high band amplified signal into a load through a single output port of an output matching network;
wherein the multi-band path comprises l multi-band stages and l−1 multi-band interstage matching networks (ISMNs).

19. The method of claim 18, wherein the low band path comprises m low band stages and m−1 low band interstage matching networks (ISMNs), and wherein the high band path comprises n high band stages and n−1 high band ISMNs.

20. The method of claim 18, further comprising matching an output impedance of the multi-band path to an input impedance of at least one of the low band path and the high band path.

\* \* \* \* \*